(12) United States Patent
Meier et al.

(10) Patent No.: US 8,093,975 B2
(45) Date of Patent: Jan. 10, 2012

(54) SEMICONDUCTOR SWITCHING MODULE OPTIMIZED FOR RESISTANCE TO SHORT CIRCUITS

(75) Inventors: Markus Meier, Rieden (DE); Bertrand Viala, Keilsruhe (DE); Stephan Jonas, Neunburg (DE)

(73) Assignee: Siemens Aktiengesellschaft, Munich (DE)

( * ) Notice: Subject to any disclaimer, the term of this patent is extended or adjusted under 35 U.S.C. 154(b) by 1162 days.

(21) Appl. No.: 11/896,561

(22) Filed: Sep. 4, 2007

(65) Prior Publication Data

US 2008/0061912 A1  Mar. 13, 2008

(30) Foreign Application Priority Data

Sep. 8, 2006 (EP) ..................................... 06018862

(51) Int. Cl.
*H01H 9/02* (2006.01)
*H02B 1/00* (2006.01)
*H05K 5/00* (2006.01)

(52) U.S. Cl. .......................... 335/202; 361/730; 361/667

(58) Field of Classification Search .................. 361/667; 335/202

See application file for complete search history.

(56) References Cited

U.S. PATENT DOCUMENTS

| | | | | |
|---|---|---|---|---|
| 2,369,018 A * | 2/1945 | Cavicchioli | ..................... | 137/71 |
| 2,729,722 A * | 1/1956 | Nelsen | ............................ | 218/30 |
| 2,811,573 A * | 10/1957 | Williams | ...................... | 174/15.1 |
| 3,501,731 A * | 3/1970 | Patterson | ...................... | 337/203 |
| 4,609,902 A * | 9/1986 | Lenk | .............................. | 337/30 |
| 5,193,049 A * | 3/1993 | Jackson | ........................ | 361/676 |
| 5,360,129 A * | 11/1994 | Lee | ................................. | 220/1.5 |
| 5,444,295 A * | 8/1995 | Lake et al. | ..................... | 257/678 |
| 5,457,296 A * | 10/1995 | Neill et al. | .................... | 200/306 |
| 5,485,340 A * | 1/1996 | Avitan | ............................ | 361/45 |
| 5,574,624 A * | 11/1996 | Rennie et al. | ................. | 361/676 |
| 5,710,402 A * | 1/1998 | Karnbach et al. | ............. | 218/157 |
| 5,767,440 A * | 6/1998 | Byron et al. | ............. | 174/17 VA |
| 5,966,291 A * | 10/1999 | Baumel et al. | ................ | 361/707 |
| 6,198,063 B1 * | 3/2001 | Kramer | ......................... | 218/157 |
| 6,407,331 B1 * | 6/2002 | Smith et al. | ..................... | 174/50 |
| 7,054,143 B2 * | 5/2006 | Eiselt et al. | .................... | 361/605 |
| 7,140,702 B2 * | 11/2006 | Byron et al. | ..................... | 312/296 |
| 7,624,888 B1 * | 12/2009 | Pudlak et al. | ................. | 220/89.2 |
| 2005/0087570 A1 * | 4/2005 | Jackman | .................... | 222/541.4 |
| 2005/0106291 A1 * | 5/2005 | Kawashima et al. | ......... | 426/106 |
| 2005/0233035 A1 * | 10/2005 | Smith | ............................. | 426/118 |
| 2006/0152889 A1 * | 7/2006 | Dalis | ............................. | 361/605 |
| 2007/0181183 A1 * | 8/2007 | Farwell et al. | .................. | 137/70 |

FOREIGN PATENT DOCUMENTS

| | | | |
|---|---|---|---|
| DE | 34 04 201 | | 8/1985 |
| DE | 3543215 A | * | 6/1987 |
| EP | 23703 A1 | * | 2/1981 |
| EP | 1 420 624 | | 5/2004 |
| GB | 2 396 059 | | 6/2004 |
| JP | 2005313973 A | * | 11/2005 |

* cited by examiner

*Primary Examiner* — Xiaoliang Chen
*Assistant Examiner* — Nathan Milakovich
(74) *Attorney, Agent, or Firm* — Harness, Dickey & Pierce, P.L.C.

(57) ABSTRACT

A semiconductor switching module including a housing having openings to remove pressure which occurs during a short circuit. The housing openings, which can be sealed by thin walls dimensioned so that so that parts which carry current cannot be touched from outside and the walls can be destroyed or removed by the pressure which occurs during a short circuit.

15 Claims, 1 Drawing Sheet

SEMICONDUCTOR SWITCHING MODULE OPTIMIZED FOR RESISTANCE TO SHORT CIRCUITS

PRIORITY STATEMENT

The present application hereby claims priority under 35 U.S.C. §119 on European patent application number EP06018862 filed Sep. 8, 2006, the entire contents of which is hereby incorporated herein by reference.

FIELD

Embodiments of the invention generally concern a semiconductor switching module with a housing, the housing having openings to carry away pressure which occurs in the case of a short circuit. Embodiments of the invention also generally concern such a housing for a semiconductor switching module.

BACKGROUND

Switching devices for load branches are used, for example, in switching stations. These switching stations are usually protected from short circuits at several levels (supply, distribution, load). The current magnitude of the maximum possible short circuit at each level depends on the components of the station. From the customer's point of view, it is worthwhile to use switching devices of which the maximum permitted short circuit current is as high as possible. This simplifies planning, and avoids additional steps, which affect cost, to limit the short circuit height.

In the IEC, the behavior of the switching device is separated into two assignment types in the case of a maximum short circuit current in association with a specified short circuit protective device (circuit breaker or fuse). In the case of assignment type 1, the switching device may be defective after the short circuit, but station parts or persons must not be endangered (e.g. it must not be possible to touch parts which carry current). In the case of assignment type 2, the switching device must still be capable of functioning after the short circuit, but repairs to the switching device are permitted. For switching devices, fulfillment of assignment type 1 is the minimum requirement.

The stresses which occur in the case of short circuits are brief, abrupt pressure waves, which result from the vaporization of current-carrying parts, above all bonding wires. In the case of a rigid, impermeable housing, these may cause the housing to burst. Approaches to a solution are to make the housing in extremely rigid, strong form—to stand up to the pressure—or to provide the housing with sufficiently large openings—to make it possible to reduce the pressure. The first solution results in very expensive, high-volume constructions. The second solution results in cost-optimized constructions, but often conflicts with other requirements of the product.

In the case of many products, both ways are possible only to a limited extent, so that finally the size of the maximum permitted short circuit current is limited. In the case of the semiconductor power modules considered here, the maximum short circuit currents for bonded modules are significantly less than 50 kA, if the outer wall of the device is very near the wall of the semiconductor module. Greater short circuit currents can only be reached by a sufficiently large distance from the outer wall of the device and sufficient ventilation. Another approach to a solution is to make the outer wall of a very strong material, e.g. steel sheet, which increases the cost and dimensions of the device.

SUMMARY

In at least one embodiment, the invention is directed to a semiconductor switching module which has an inexpensive, compact housing construction, and which stands up to the above-mentioned short circuit requirements.

In at least one embodiment, the invention is directed to giving such a housing for a semiconductor switching module.

In at least one embodiment, a semiconductor switching module includes a housing, the housing having openings, which can be sealed by thin walls, to carry away pressure which occurs in the case of a short circuit, the thin walls being dimensioned so that they can be destroyed or removed by the pressure which occurs in the case of a short circuit, and the openings being dimensioned so that parts which carry current cannot be touched from outside.

The semiconductor switching module according to at least one embodiment of the invention is characterized in that despite compact, inexpensive construction, a high short circuit value is achieved, the disadvantages of the traditional open housing construction being avoided. In principle, this is achieved in that in the case of a short circuit, the pressure can be carried away via defined openings. In the case of normal operation, these openings are sealed by thin walls. By sealing in this way, for example, the sealing which is required in the case of bonded semiconductor switching modules can be kept in the housing, and an optically closed housing can be implemented.

In the case of a short circuit, the thin walls are subjected to pressure, so that openings in the housing are released and the pressure can escape through them. As far as their size is concerned, the openings are in such a form that even in the open state, it is impossible to touch current-carrying parts, so that endangering persons is impossible. Also, there is no increase of the required voltage gaps to adjacent devices because of large exhaust openings, and the visual design of the device is also not affected.

In an advantageous embodiment, at least one outer wall of the semiconductor switching module is in the form of part of the housing. Because the outer wall of the module partly corresponds to the device wall, specially compact and inexpensive construction can be achieved.

In another advantageous embodiment, the semiconductor switching module is implemented as a power module with a direct copper bonding (DCB). In these power modules, power semiconductors are soldered on the DCB, and are connected with bonding wires on the DCB. The result here is an increase of the short circuit resistance in the case of assignment type 1, with compact construction and without affecting the standard production processes, particularly sealing.

In another advantageous embodiment, the housing is made of insulating plastic. In this way, particularly if the outer wall of the module (partly) corresponds to the housing, specially inexpensive construction is possible.

In another advantageous embodiment, the thin walls are implemented as adhesive labels. Implementing the thin walls as self-adhesive plastic parts (adhesive labels) makes it possible to print variable information, via which it is possible, for example, to identify the relevant switching module, on them, and to attach it to the semiconductor switching module in an inexpensive manner.

BRIEF DESCRIPTION OF THE DRAWINGS

Below, the invention is described and explained in more detail on the basis of the embodiments which are shown in the figures.

DETAILED DESCRIPTION OF THE EXAMPLE EMBODIMENTS

Figure 1:
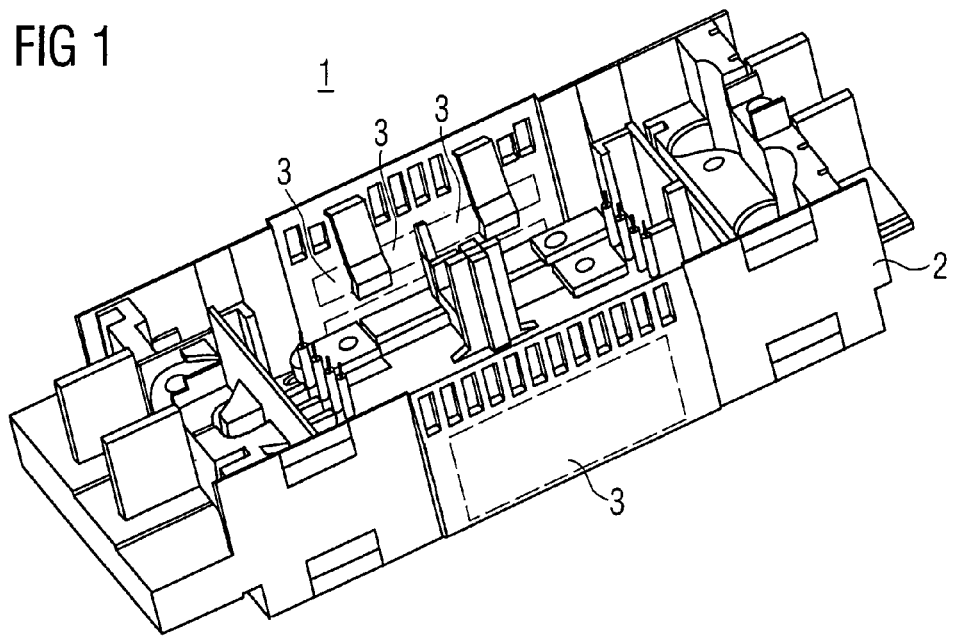
FIG. 1 shows a power module according to an embodiment of the invention, with side walls attached on the sides with adhesive.

The terminology used herein is for the purpose of describing particular embodiments only and is not intended to be limiting of the present invention. As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described. Like numbers refer to like elements throughout. As used herein, the terms "and/or" and "at least one of" include any and all combinations of one or more of the associated listed items.

FIG. 1 shows a semiconductor switching module according to an embodiment of the invention, which is implemented as a power module 1 with a direct copper bonding (DCB). The stresses which occur in the case of short circuits are brief, abrupt pressure waves, which result from the vaporization of current-carrying parts 4, above all bonding wires.

The power module 1 according to an embodiment of the invention—including DCB with power semiconductors, which are connected with bonding wires on the DCB, soldered on it—is characterized in that despite compact and inexpensive construction (module outer wall—preferably of insulating plastic—is also device outer wall), a high short circuit value is achieved. It is achieved in that in the case of a short circuit, the pressure can be carried away via defined openings 5 in the housing 2.

In the case of normal operation, these openings 5 are sealed by thin walls 3, in the embodiment adhesive labels. By sealing in this way, the sealing which is required in the case of bonded semiconductor switching modules can be kept in the housing 2, and an optically closed housing 2 can be implemented. In the case of a short circuit, these thin walls 3 (e.g. adhesive labels) are subjected to pressure, so that openings 5 in the housing 2 are released and the pressure can escape through them. Implementing the thin walls 3 as self-adhesive plastic parts (adhesive labels) also makes it possible to print variable information, via which it is possible, for example, to identify the relevant switching module 1, on them.

Figure 2:
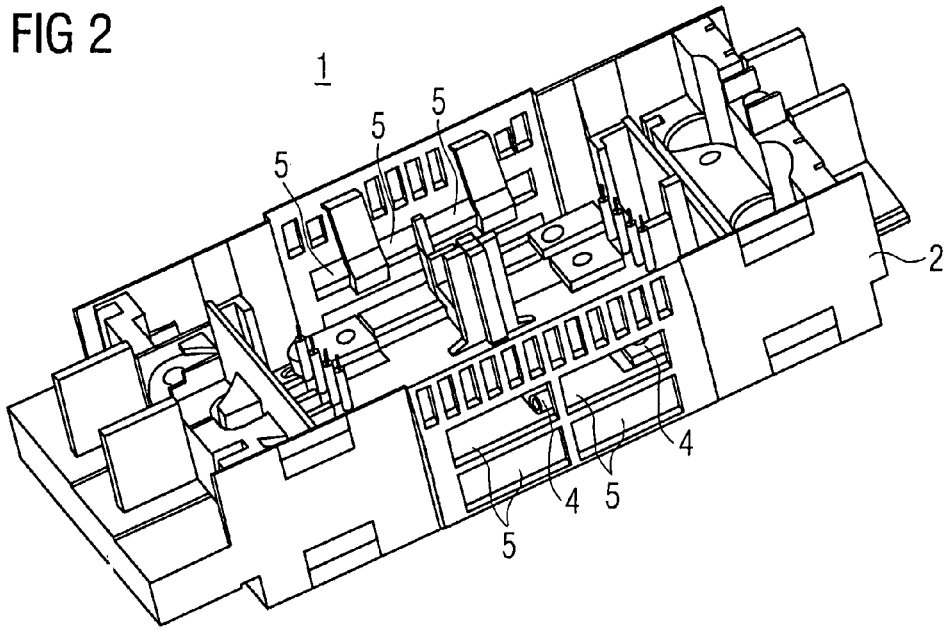
FIG. 2 shows the power module from FIG. 1, with open exhaust openings.

FIG. 2 shows the power module 1 from FIG. 1 with open exhaust openings 5 in the housing 2. As far as their size is concerned, the openings 5 are in such a form that even in the open state, it is impossible to touch current-carrying parts 4, so that endangering persons is impossible.

Summarizing, an embodiment of the invention concerns a semiconductor switching module with a housing, the housing having openings to carry away pressure which occurs in the case of a short circuit. An embodiment of the invention is based on the object of giving a semiconductor switching module which has an inexpensive, compact housing construction, and with which after a short circuit there is no danger to station parts or persons. This object is achieved by a semiconductor switching module with a housing, the housing having openings, which can be sealed by thin walls, to carry away pressure which occurs in the case of a short circuit, the thin walls being dimensioned so that they can be destroyed or removed by the pressure which occurs in the case of a short circuit, and the openings being dimensioned so that parts which carry current cannot be touched from outside.

The semiconductor switching module according to an embodiment of the invention is characterized in that despite compact, inexpensive construction, a high short circuit value is achieved, the disadvantages of the traditional open housing construction being avoided. In principle, this is achieved in that in the case of a short circuit, the pressure can be carried away via defined openings. In the case of normal operation, these openings are sealed by thin walls. By sealing in this way, for example, the sealing which is required in the case of bonded semiconductor switching modules can be kept in the housing, and an optically closed housing can be implemented.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A semiconductor switching module, comprising:
   a housing, the housing including openings, which are sealed by thin walls during normal operation of the semiconductor switching module, to carry away pressure which occurs in a case of a short circuit, the thin walls being dimensioned to be at least one of destroyed and removed by the pressure which occurs in the case of a short circuit, and the openings being further dimensioned so that parts which carry current cannot be touched from outside of the semiconductor switching module.

2. The semiconductor switching module as claimed in claim 1, wherein at least one outer wall of the semiconductor switching module is in the form of part of the housing.

3. The semiconductor switching module as claimed in claim 1, wherein the semiconductor switching module is implemented as a power module with direct copper bonding.

4. The semiconductor switching module as claimed in claim 1, wherein the housing is made of insulating plastic.

5. The semiconductor switching module as claimed in claim 1, wherein the thin walls are implemented as adhesive labels.

6. A housing for a semiconductor switching module, comprising:
    openings, sealable by thin walls, to carry away pressure which occurs in the case of a short circuit, the walls being dimensioned to be destroyed by the pressure which occurs in a case of a short circuit, and the openings being dimensioned so that parts which carry current cannot be touched from outside of the semiconductor switching module.

7. The housing as claimed in claim 6, wherein part of the housing is in the form of at least one outer wall of the semiconductor switching module.

8. The housing as claimed in claim 6, wherein the housing is made of insulating plastic.

9. The housing as claimed in claim 6, wherein the thin walls are implemented as adhesive labels.

10. The semiconductor switching module as claimed in claim 2, wherein the semiconductor switching module is implemented as a power module with a direct copper bonding.

11. The semiconductor switching module as claimed in claim 2, wherein the housing is made of insulating plastic.

12. The semiconductor switching module as claimed in claim 2, wherein the thin walls are implemented as adhesive labels.

13. The housing as claimed in claim 7, wherein the housing is made of insulating plastic.

14. The housing as claimed in claim 7, wherein the thin walls are implemented as adhesive labels.

15. The semiconductor switching module as claimed in claim 1, wherein the semiconductor switching module is one of a circuit breaker or a fuse.

* * * * *